United States Patent
Nasu (10) Patent No.: US 6,747,489 B2
(45) Date of Patent: Jun. 8, 2004

(54) FREQUENCY MULTIPLYING CIRCUITRY WITH A DUTY RATIO VARYING LITTLE

(75) Inventor: Kouji Nasu, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 58 days.

(21) Appl. No.: 10/259,607

(22) Filed: Sep. 30, 2002

(65) Prior Publication Data
US 2003/0117180 A1 Jun. 26, 2003

(30) Foreign Application Priority Data
Dec. 26, 2001 (JP) ......................... 2001-393761

(51) Int. Cl.[7] .............................................. H03B 19/00
(52) U.S. Cl. ..................... 327/116; 327/119; 327/95; 327/170
(58) Field of Search .................. 327/115, 116, 327/117, 118, 119, 120, 172, 374, 375–7, 94, 95; 331/53

(56) References Cited

U.S. PATENT DOCUMENTS 5,721,511 A * 2/1998 Lee .......................... 327/540
6,169,436 B1 * 1/2001 Marbot ....................... 327/270

* cited by examiner

Primary Examiner—Timothy P. Callahan
Assistant Examiner—An T. Luu
(74) Attorney, Agent, or Firm—Rabin & Berdo, P.C.

(57) ABSTRACT

Frequency multiplying circuitry includes a couple of integrator circuits. The one integrator circuit charges a capacitor with a larger time constant via a resistor when an input clock signal is in its high level and then discharges it with a smaller time constant when the clock signal is in its low level. The other integrator circuit charges and discharges its capacitor in the opposite manner to the one integrator circuit as to the level of the clock signal. An output circuit compares the output voltages of both integrator circuits with a reference voltage and raises the level of its output signal when either one of the output voltages drops below the reference voltage. The duty ratio of the circuitry is therefore little susceptible to the frequency of the input signal and power supply voltage.

21 Claims, 6 Drawing Sheets

FREQUENCY MULTIPLYING CIRCUITRY WITH A DUTY RATIO VARYING LITTLE

BACKGROUND OF THE INVENTION

1. Field of the Invention

The present invention relates to frequency multiplying circuitry for doubling or otherwise multiplying the frequency of an input signal.

2. Description of the Background Art

It is a common practice with frequency multiplying circuitry to use delay available with an integrator circuit. Specific conventional frequency multiplying circuitry includes one inverter for inverting the level of an input clock signal. The one inverter has its output connected to another inverter with a resistor. Between the resistor and the other inverter, a node is formed, between which and the ground a capacitor is connected. The other inverter has its output connected to one input of an exclusive OR (EOR) gate, which has another input terminal connected to receive the clock signal. As a result, the exclusive OR gate outputs a frequency that is equal to a multiple of the frequency of the clock signal.

When the clock signal goes high, the one inverter also brings its output high, which is in turn input to an integrator circuit made up of the resistor and capacitor. Consequently, a signal appearing on the node, i.e., the output of the integrator circuit drops from its high level with a preselected time constant. When the level of the input signal drops to a threshold voltage particular to the other inverter, the output of the other inverter goes high. The exclusive OR gate produces an exclusive OR made between the clock signal and the output of the other inverter. More specifically, the output of the exclusive OR gate goes high at the positive-going edge of the clock signal and then goes low on the elapse of a preselected delay time.

As stated above, the frequency multiplying circuitry outputs its high level twice during a single period of the clock signal, i.e., doubles the frequency of the input clock signal.

The conventional frequency multiplying circuitry described above has the following problem left unsolved. The duration of the high level of the multiplied output signal is dependent upon the time constant of the integrator circuit and the threshold voltage of the other inverter. As a result, the duty ratio of the output signal varies due to the fluctuation of the frequency of the clock signal and that of power supply voltage. This causes successive logical circuitry controlled by the output signal of the frequency multiplying circuit to malfunction. It is to be noted that the above-mentioned duty ratio refers to the ratio of the duration of the high level to the single period of the clock signal.

SUMMARY OF THE INVENTION

It is an object of the present invention to provide frequency multiplying circuitry whose duty ratio is little susceptible to the frequency of an input clock signal and power supply voltage.

In accordance with the present invention, frequency multiplying circuitry multiplies the frequency of an input signal having a first logical level and a second logical level, different from the first logical level, alternating with each other at a preselected period. The circuitry includes a first and a second charging and discharging circuit. The first charging and discharging circuit charges a first capacitance with a first time constant representative of a relaxation time, which is based on the transient response of an electric circuit, in response to the first logical level of the input signal and then discharges it with a second time constant smaller than the first time constant. The second charging and discharging circuit charges a second capacitance with the first time constant in response to the second logical level of the input signal and then discharges it with the second time constant in response to the first logical level of the input signal. An output circuit compares the output voltages of the first and second charging and discharging circuits with a reference voltage and raises the level of an output signal when either one of the two output voltages drops below the reference voltage. A controller controls the charging and discharging of the first and second charging and discharging circuits in response to the input signal and output signal.

Also, in accordance with the present invention, frequency multiplying circuit includes a first and a second charging and discharging circuit. The first charging and discharging circuit includes a pair of a first and a second selector and a pair of a third and a fourth selector operating complementarily to each other in response to control signals each having a particular level different from each other. A first capacitance intervenes between a first signal line connecting the first and second selectors and a second signal line connecting the third and fourth selectors. A feed potential line applies power supply voltage to the first selector while a reference potential line applies a first reference potential to the third selector. A first resistor intervenes between the first reference potential terminal of the second selector and a second reference potential, e.g. ground. Likewise, a second resistor intervenes between a second reference potential terminal of the fourth selector and the second reference potential and has higher resistance than the first resistor. The first and fourth selectors each become active when the respective control signal is in a first logical level. On the other hand, the second and third selectors each become active when the respective control signal is in a second logical level different from the first logical level. The second charging and discharging circuit includes a pair of a fifth and a sixth selector and a pair of a seventh and an eighth selector also operating complementarily to each other in response to control signals each having a particular level different from each other. A second capacitance circuit intervenes between a third signal line connecting the fifth and sixth selectors and a fourth signal line connecting the seventh and eighth selectors. A feed potential line applies the power supply voltage to the fifth selector while a reference potential line applies the first reference potential to the seventh selector. A third resistor intervenes between the third reference potential terminal of the sixth selector and the second reference potential. Likewise, a fourth resistor intervenes between the fourth reference potential terminal of the eighth selector and the second reference potential and has higher resistance than the third resistor. The fifth and eighth selectors each become active when the respective control signal is in a first logical level while the sixth and seventh selectors each become active when the respective control signal is in a second logical level. An output circuit compares voltages output from the first and second charging and discharging circuits with the first reference voltage and outputs its high level as an output signal when either one of the two voltages drops below the reference voltage. A controller feeds the control signals to the first and second charging and discharging circuits in response to the input signal and output signal.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
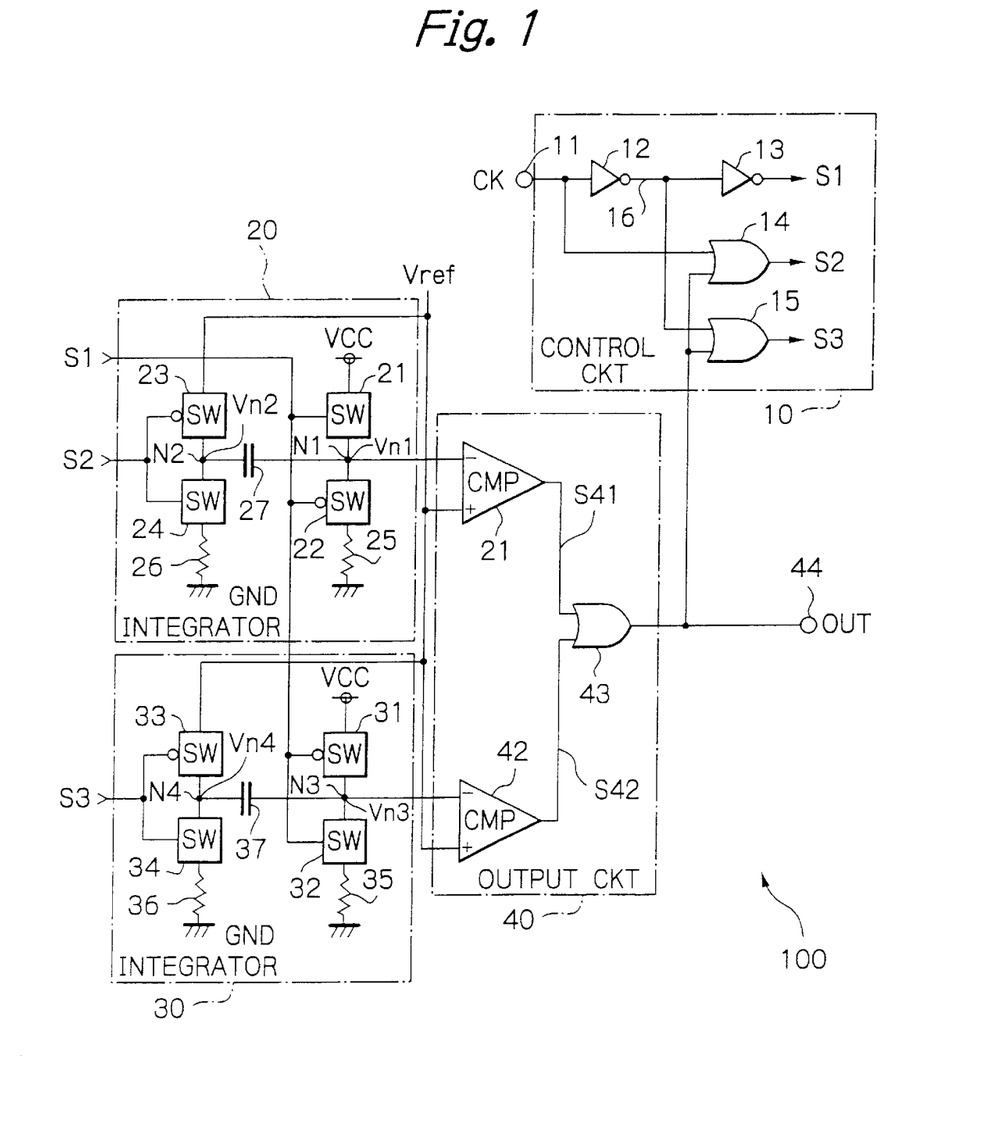
FIG. 1 is a schematic block diagram showing a preferred embodiment of the frequency multiplying circuitry in accordance with the present invention.

Referring to FIG. 1 of the drawings, frequency multiplying circuitry embodying the present invention, generally designated with the reference numeral 100, is generally made up of a control circuit 10, a first and a second integrator circuit 20 and 30, respectively, and an output circuit 40.

The control circuit 10 is adapted to receive an input clock signal CK and an output signal OUT and generate control signals S1, S2 and S3 in response to the signals CK and OUT for switching the two integrator circuits 20 and 30. More specifically, the control circuit 10 includes an input terminal 11, inverters 12 and 13, and OR gates 14 and 15. The inverters 12 and 13 are serially connected to each other, the former inverter 12 having its input port interconnected to the input terminal 11 to which the input signal CK is applied. The latter inverter 13 produces the control signal S1 on its output. The input signal CK and output signal OUT are also input to the OR gate 14. The OR gate 14 produces the control signal S2 on its output. A signal 16 resultant from the inversion of the input signal CK by the inverter 12 and the output signal OUT coming from the output circuit 40 are input to the OR gate 15. In response, the OR gate 15 produces the control signal S3 on its output. In the following, signals are designated with reference numerals attached to connections on which they appear.

The one integrator circuit 20 includes switches (SW) 21, 22, 23 and 24. The control signal S1 complementarily turns on or off the switches 21 and 22. Likewise, the control signal S2 complementarily turns on or off the switches 23 and 24. The switch 21 selectively connects or disconnects a power supply potential VCC to or from a node N1. In the illustrative embodiment, the control signal S1 turns on the switch 21 when it is in its high level. The switch 22 selectively connects or disconnects the node N1 to or from a reference, e.g. ground potential GND via a resistor 25 having a resistance R25. The control signal S1 turns on the switch 22 when it is in its low level.

The switch 23 selectively connects or disconnects a reference potential Vref to or from a node N2. The control signal S2 turns on the switch 23 when it is in its low level. The switch 24 selectively connects or disconnects the node N2 to or from the ground potential GND via a resistor 26 having a resistance R26. The control signal S2 turns on the switch 24 when it is in its high level. The nodes N1 and N2A are interconnected to each other by a capacitor 27 having a capacitance C27. The resistance R25 of the resistor 25 is selected to be lower than the resistance R26 of the resistor 26.

Similarly, the other integrator circuit 30 includes switches 31 and 32 complementarily turned on or off in response to the control signal S1 and switches 33 and 34 complementarily turned on or off in response to the control signal S3. The switch 31 selectively connects or disconnects the power supply potential VCC to or from a node N3. The control signal S1 turns on the switch 31 when it is in its low level. The switch 32 selectively connects or disconnects the node N3 to or from the ground potential GND via a resistor 35 having a resistance R35. The control signal S1 turns on the switch 32 when it is in its high level.

The switch 33 selectively connects or disconnects the reference potential Vref to or from a node N4. The control signal S3 turns on the switch 33 when it is in its low level. The switch 34 selectively connects or disconnects the node N3 to or from the ground potential GND via a resistor 36 having a resistance R36. The control signal S3 turns on the switch 34 when it is in its high level. The nodes N3 and N4 are interconnected to each other by a capacitor 37 with a capacitance C37. The resistance R35 of the resistor 35 is selected to be lower than the resistance R36 of the resistor 36.

The output circuit 40 includes a couple of comparators (CMP) 41 and 42 and an OR gate 43 interconnected as illustrated. The one comparator 41 is adapted to compare a potential Vn1 on the node N1 of the integrator circuit 20 with the reference voltage Vref. Likewise, the other comparator 42 is adapted to compare a potential Vn3 on the node N3 of the integrator circuit 30 with the reference voltage Vref. The output of the comparator 41 goes low if the potential Vn1 is higher than the reference voltage Vref, and goes high if the former is equal to or lower than the latter. Similarly, the output of the comparator 42 goes low if the potential Vn3 is higher than the reference potential Vref, and goes high if the former is equal to or lower than the latter. The comparators 41 and 42 have outputs thereof respectively connected to two inputs of the OR gate 43. The OR gate 43 produces the output signal OUT on its output terminal 44, the output signal OUT also being delivered to the control circuit 10.

Figure 2:
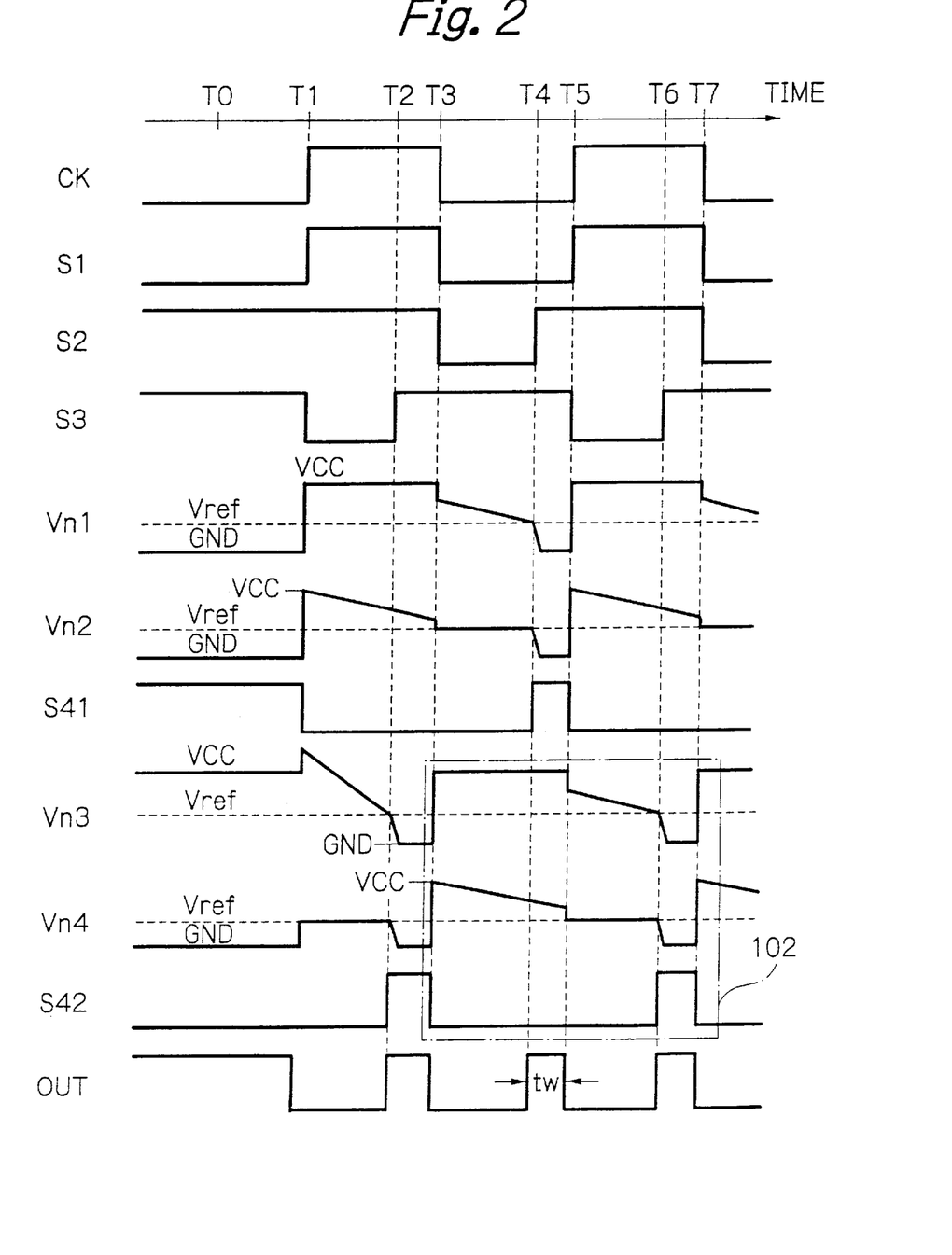
FIG. 2 is a timing chart showing waveforms useful for understanding a specific operation of the illustrative embodiment.

A specific operation of the frequency multiplying circuitry 100 will be described with reference to FIG. 2. As shown, at a time T0, the input signal or clock signal CK remains in the low level thereof while the control signals S1 and S3 remain in the low and high levels thereof, respectively. The switch 22 is therefore turned on to cause the ground potential GND to appear on the node N1 as the potential Vn1. Also, a signal S41 output from the comparator 41 is in its high level, so that the output signal OUT of the OR gate 43 is in its high level. In this condition, the control signal S2 is in its high level and continuously turns on the switch 24. Consequently, the ground potential GND appears on both ends of the capacitor 27, i.e., the capacitor 27 stores no charge.

On the other hand, the switches 31 and 34 both remain in the ON or conductive state thereof. The power supply potential VCC therefore appears on the node N3 as the potential Vn3 while the ground potential GND appears on the node N4 as a potential Vn4. Consequently, the capacitor 37 is charged to the power supply potential VCC. A signal S42 output from the comparator 42 is in its low level.

At a time T1, the input signal CK goes high and causes the control signal S1 to go high. At this instant, the control signal S2 remains in its high level. Therefore, in the integrator circuit 20, the switch 21 is turned on with the result that the potential Vn1 on the node N1 rises to the power supply potential VCC. At the same time, the signal S41 output from the comparator 41 goes low, causing the control signal S3 and output signal OUT to go low. At this instant, the switch 24 is held in its ON state. As a result, the potential Vn2 on the node N2 instantaneously rises to the power supply potential VCC and then drops little by little in accordance with the time constant of an integrator, which is constituted by the capacitor 27 and resistor 26.

In the other integrator circuit 30, the switches 32 and 33 are turned on at the time T1. As a result, the potential Vn4 on the node N4 instantaneously rises from the ground potential GND to the reference potential Vref. Because the capacitor 37 has already been charged to the power supply potential VCC, the sum of the potentials VCC and Vref appears on the node N3 as the potential Vn3. Subsequently, the potential Vn3 on the node N3 drops little by little in accordance with the time constant of an integrator, which is constituted by the capacitor 37 and resistor 35.

The potentials Vn2 and Vn3 on the nodes N2 and N3, respectively, both drop with the elapse of time, as stated above. However, the potential Vn3 drops more rapidly than the potential Vn2 because the integrator constituted by the capacitor 37 and resistor 35 has a smaller time constant than the integrator constituted by the capacitor 27 and resistor 26.

At a time T2, the potential Vn3 on the node N3 drops to the reference potential Vref, causing the output S42 of the comparator 42 to go high. As a result, the output signal OUT and therefore the control signal S3 goes high This turns on the switch 34 and thereby connects the node N4 to the ground potential GND via the resistor 36. Consequently, the potentials Vn3 and Vn4 on the nodes N3 and N4, respectively, sharply drop to the ground potential GND.

At a time T3, the input signal CK goes low and causes the control signal S1 to go low. At this instant, the control signal S3 remains in its high level. As a result, in the integrator circuit 30, the switch 31 is turned on and causes the potential Vn3 on the node N3 to rise to the power supply potential VCC. At the same time, the output signal S42 of the comparator 42 goes low, causing the control signal S2 and output signal OUT to go low. Further, because the switch 34 is in its ON state, the potential Vn4 on the node N4 rises to the power supply potential VCC via the capacitor 37 for a moment and then drops little by little in accordance with the time constant of the integrator, which is constituted by the capacitor 37 and resistor 36.

On the other hand, in the integrator circuit 20, the switches 22 and 23 are turned on at the time T3, causing the potential Vn2 on the node N2 to instantaneously drop to the reference potential Vref. The potential Vn1 on the node N1 varies by the same amount as the potential Vn2 because the nodes N1 and N2 are interconnected via the capacitor 27. Subsequently, the potential Vn1 on the node N1 drops little by little in accordance with the time constant of the integrator constituted by the capacitor 27 and resistor 25.

At a time T4, the potential Vn1 on the node N1 drops to the reference potential Vref, causing the output signal S41 of the comparator 41 to go high. The output signal OUT therefore goes high and causes the control signal S2 to go high. The control signal S2 then turns on the switch 24 and thereby connects the node N2 to the ground potential GND via the resistor 26. As a result, the potentials Vn1 and Vn2 on the nodes N1 and N2, respectively, sharply drop to the ground potential GND.

At a successive time T5, the input signal CK goes high, causing the control signal S1 to go high. At this instant, the control signal S2 is held in its high level. Therefore, in the integrator circuit 20, the switch 21 is turned on to cause the potential Vn1 on the node N1 to rise to the power supply potential VCC. This causes the output signal S41 of the comparator 41 and therefore the control signal S3 and output signal OUT to go low. At this instant, the switch 24 is in its ON state. Therefore, the potential Vn2 on the node N2 instantaneously raises to the power supply potential VCC via the capacitor 27 and then drops gradually in accordance with the time constant of the integrator constituted by the capacitor 27 and resistor 26.

In the integrator circuit 30, the switches 32 and 33 are turned on at the time T5 and cause the potential Vn4 on the node N4 to instantaneously drop to the reference voltage Vref. The potential Vn3 on the node N3 drops by the same amount as the potential Vn4 because the nodes N3 and N4 are interconnected via the capacitor 37. Subsequently, the potential Vn3 on the node N3 drops little by little in accordance with the time constant of the integrator constituted by the capacitor 37 and resistor 35.

At a time T6, the potential Vn3 on the node N3 drops to the reference potential Vref, causing the output signal S42 of the comparator 42 to go high. As a result, the output signal OUT and therefore the control signal S3 go high. The control signal S3 then turns on the switch 34 and thereby connects the node N4 to the ground potential GND via the resistor 26. Consequently, the potentials Vn3 and Vn4 on the nodes N3 and N4, respectively, sharply drop to the ground potential GND.

At a further successive time T7, the input signal CK goes low. In response, the circuits 10 through 40 of the circuitry 100 operate in the same manner as at the time T3. Thereafter, the circuits 10 through 40 repeat the same operation as performed from the times T3 to T7.

A pulse width or duration tw during which the output signal OUT is in its high level will be described with reference to numerical expressions hereinafter. Let the following description concentrate on the potentials Vn3 and Vn4 on the nodes N3 and N4 appearing during the interval between the times T3 and T7, over which signal waveforms are stable, as enclosed with a dash-and-dot box 102 in FIG. 2.

A period of time elapsed since the time T3 is represented by t. The potential Vn4 on the node N4 between the times T3 and T5 may therefore be expressed as:

$$Vn4(t) = VCC \times \exp\{-t/(C37 \times R36)\}.$$

The half period of the input signal CK is represented by TW. The potential Vn4(T5−0) appearing on the node N4 just before the switches 31 through 34 change the states thereof at the time T5 is produced by:

$$Vn4(T5-0) = VCC \times \exp\{-TW/(C37 \times R36)\}.$$

The above expression derives:

$$R36 = TW/\{C37 \times \ln(VCC/Vn4(T5-0))\}. \tag{1}$$

As soon as the switches 31 through 34 change the states thereof at the time T5, the reference potential Vref appears on the node N4 as the potential Vn4. More specifically, the potential Vn4 drops by a voltage equal to the difference, Vn4(T5−0)−Vref, for a moment. Because the nodes N3 and N4 are interconnected via the capacitor 37, the potential Vn3 on the node N3 also drops by the amount corresponding to $$Vn4(T5-0)-Vref \text{ to } VCC+Vref-Vn4(T5-0)$$

for a moment.

Subsequently, the charge stored in the capacitor 37 is released through the resistor 35. A period of time elapsed since the time T5 is represented by t. The potential Vn3 on the node N3 may therefore be expressed as:

$$Vn3(t)=\{VCC+Vref-Vn4(T5-0)\}\times\exp\{-t/(C37\times R35)\}.$$

When the potential Vn3 has reached the reference potential Vref in the period of time t=tw, there holds:

$$Vref=\{VCC+Vref-Vn4(T5-0)\}\times\exp\{-tw/(C37\times R35)\}.$$

Therefore, the period of time tw elapsed is produced by:

$$tw=(C37\times R35)\times \ln\{(VCC+Vref-Vn4(T5-0))/Vref\}. \quad (2)$$

The expression (2) derives the capacitance C37:

$$C37 = \frac{tw}{R35} \times \frac{1}{\ln\left(\frac{VCC+Vref-Vn4(T5-0)}{Vref}\right)}. \quad (3)$$

By substituting the expression (3) for the expression (1), there is produced:

$$R36 = \frac{TW}{\ln\frac{VCC}{Vn4(T5-0)} \times \frac{tw}{R35} \times \frac{1}{\ln\left(\frac{VCC+Vref-Vn4(T5-0)}{Vref}\right)}}. \quad (4)$$

The Expression (4) derives:

$$tw = \frac{R35}{R36} \times TW \times \frac{\ln\left(\frac{VCC+Vref-Vn4(T5-0)}{Vrerf}\right)}{\ln\left(\frac{VCC}{Vn4(T5-0)}\right)}. \quad (5)$$

The expression (5), except for its logarithmic term, indicates that the period of time elapsed tw is proportional to (R36/R35)×TW. Therefore, if the resistance R35 is lower than the resistance R36, then the period of time tw is shorter than the half period TW of the clock signal CK. The potential Vn3 on the node N3 therefore drops to the reference potential Vref between the times T5 and T7, causing the output signal S42 of the comparator 42 to go high.

On the other hand, the term, Vn4(T5−0), included in the logarithmic term of the expression (5) varies in dependent upon the half period TW of the clock signal CK. The half period TW increases the value of the logarithm term when extended or reduces it when shortened. It follows that the duty ratio of the output signal OUT is generally determined by the resistance ratio of the resistor 35 to the resistor 36.

As stated above, in the frequency multiplying circuitry 100, the integrator circuit 20 charges the capacitor 27 with a larger time constant when the input clock signal CK is in its high level and then discharges it with a smaller time constant when the clock signal CK is in its low level. The other integrator circuit 30 charges the capacitor 37 with a larger time constant when the clock signal CK is in its low level and then discharges it with a smaller time constant when the clock signal CK is in its high level. With this configuration, the circuitry 100 makes the duty ratio of the output signal OUT produced from the output circuit 40 little susceptible to the frequency of the clock signal CK, power supply voltage and so forth.

Figure 3:
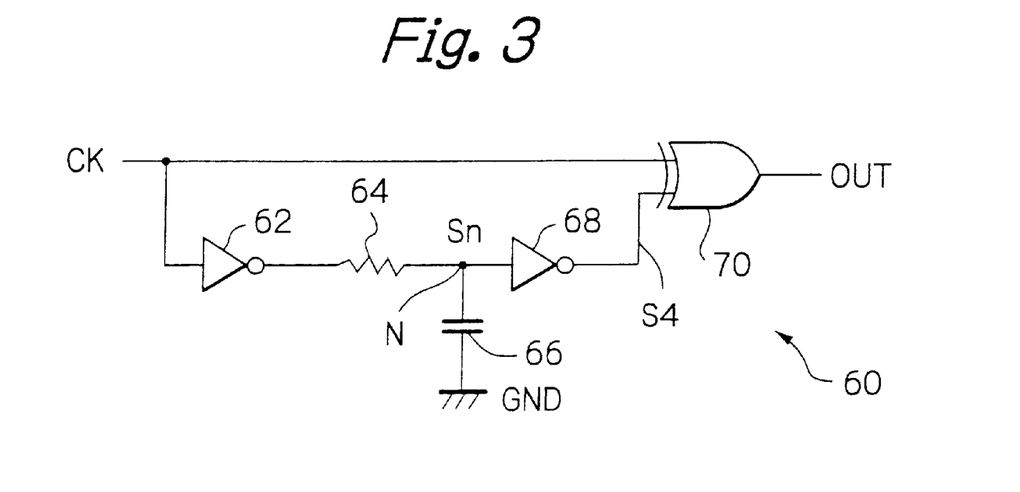
FIG. 3 is a schematic circuit diagram showing comparative frequency multiplying circuitry.

Well, reference will be made to FIGS. 3 and 4 for briefly describing a comparative frequency multiplying circuitry of the type using delay available with an integrator circuit. As shown in FIG. 3, the frequency multiplying circuitry, generally 60, includes an inverter 62 for inverting an input clock signal CK. The inverter 62 has its output connected to a node N via a resistor 64. A capacitor 66 is connected to the node N at one end and connected to ground GND at the other end.

The node N is connected to an inverter 68 whose output is connected to one input of an exclusive OR gate 70. The clock signal CK is also applied to the other input of the exclusive OR gate 70. The exclusive OR gate 70 produces a multiplied output signal OUT on its output.

Figure 4:
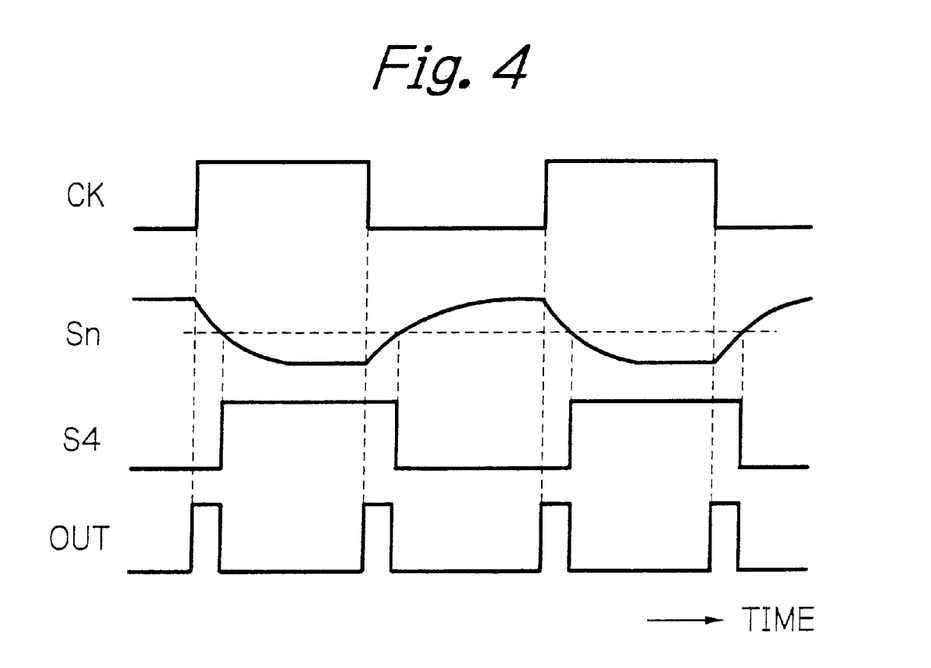
FIG. 4 shows waveforms demonstrating the operation of the comparative frequency multiplying circuitry.

As shown in FIG. 4, when the clock signal CK goes high, the output signal of the inverter 62 goes low. The output signal of the inverter 62 is fed to an integrator constituted by the resistor 64 and capacitor 66. As a result, a signal Sn on the node N, which is the output from the integrator, drops with a preselected time constant. As soon as the signal Sn, which is fed to the inverter 68, drops to the threshold voltage of the inverter 68, the output signal S4 of the inverter 68 goes high. The exclusive OR gate 70 produces an exclusive OR of the clock signal CK with the inverter output signal S4. As a result, the output signal OUT of the exclusive OR gate 70 goes high substantially at the same time as the clock signal CK goes high, and then goes low on the elapse of a predetermined delay time.

Further, the output signal OUT of the exclusive OR gate 70 goes high at the same time as the clock signal CK goes low, and then goes low on the elapse of the preselected delay time. Consequently, the output signal OUT has a frequency twice as high as the frequency of the clock signal CK.

The comparative frequency multiplying circuitry 60 has the following problem left unsolved. The duration of the high level of the multiplied output signal OUT is dependent upon the time constant of the integrator implemented by the resistor 64 and capacitor 66 and the threshold voltage of the inverter 68. Therefore, the duty ratio of the output signal OUT varies when the frequency of the clock signal CK or the power supply voltage varies.

Figure 5:
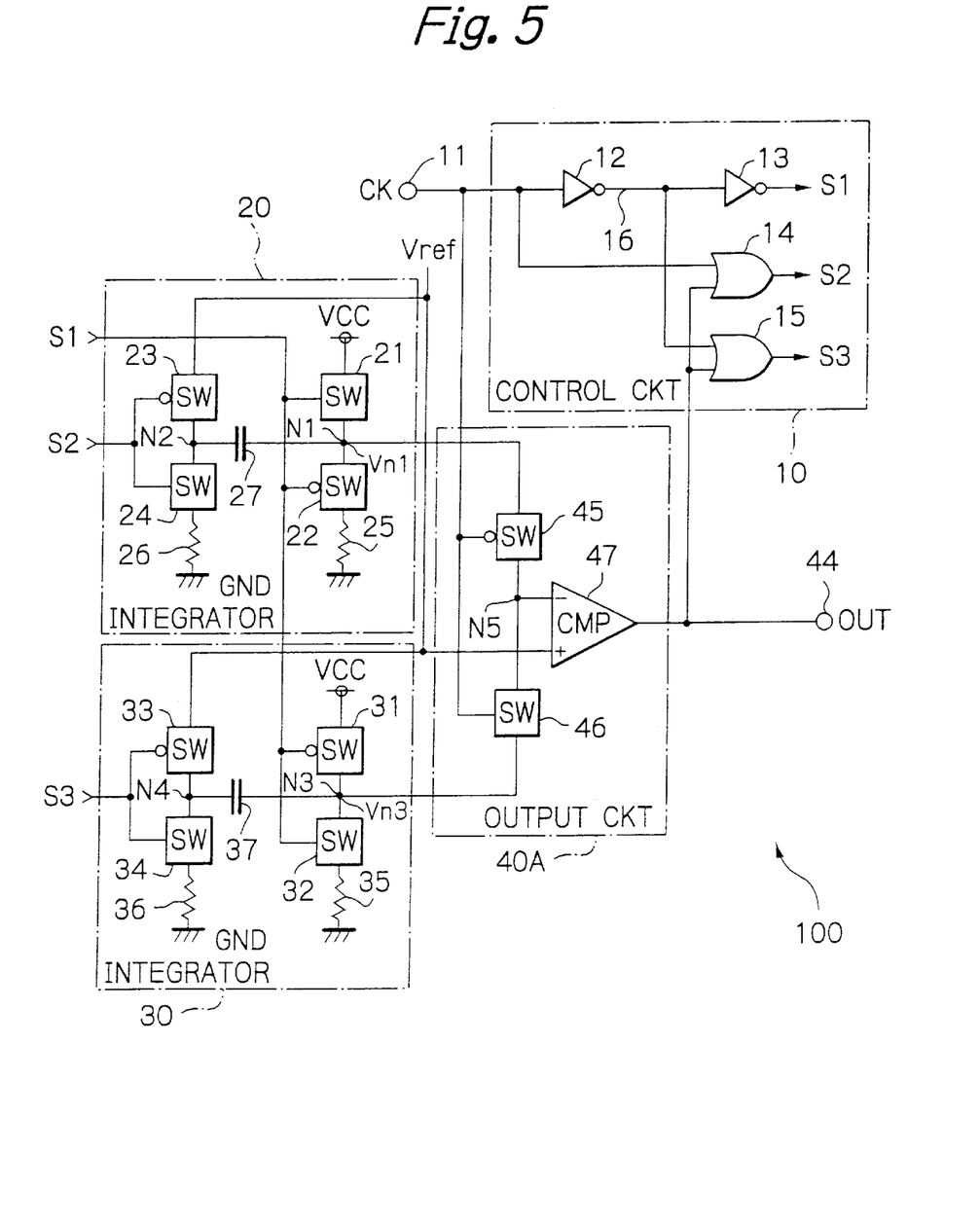
FIG. 5 is a schematic block diagram, similar to FIG. 1, showing an alternative embodiment of the present invention.

An alternative embodiment of the present invention will now be described with reference to FIG. 5. As shown, the frequency multiplying circuitry 100 is identical with the circuitry 100 of FIG. 1 except that an output circuit 40A is substituted for the output circuit 40, FIG. 1. In FIG. 5, circuit elements like the circuit elements shown in FIG. 1 are designated by identical reference numerals and will not be described in order to avoid redundancy.

As shown in FIG. 5, the output circuit 40A includes switches 45 and 46 and a comparator 47. The input clock signal CK causes switches 45 and 46 to complementarily turn on or off. The switch 45 selectively connects or disconnects nodes N1 and N5 to or from each other. The clock signal CK turns on the switch 45 when it is in its low level. The switch 46 selectively connects or disconnects a node N3 to or from the node N5. The clock signal CK turns on the switch 46 when it is in its high level.

The comparator 47 compares a potential Vn5 on the node N5 with the reference potential Vref. The output of the comparator 47 goes low if the potential Vn5 is higher than the reference potential Vref or goes high if the former is equal to or lower than the latter. The comparator 47 produces the output signal OUT on the output terminal 44 while feeding it to the control circuit 10.

Figure 6:
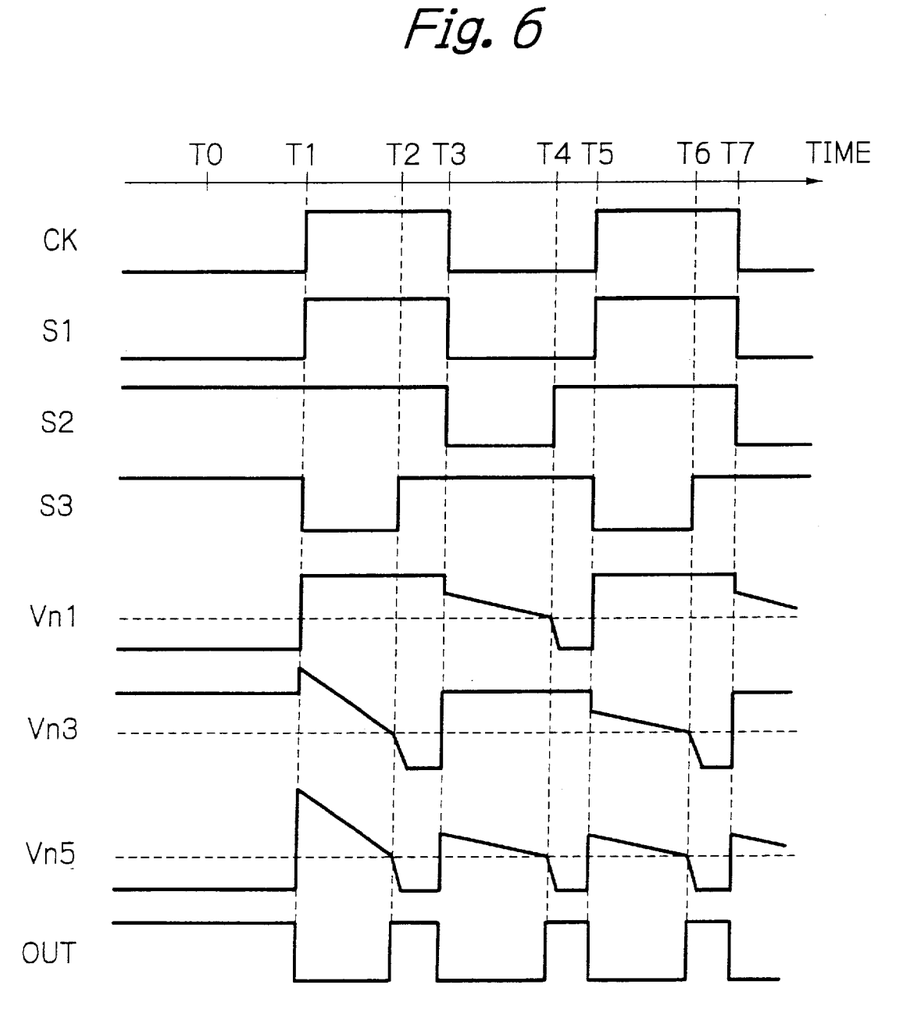
FIG. 6 is a timing chart, similar to FIG. 2, useful for understanding a specific operation of the embodiment of FIG. 5.

FIG. 6 demonstrates a specific operation of the illustrative embodiment. In the illustrative embodiment, the first and second integrator circuits 20 and 30 operate in the same manner as in the previously described embodiment. The potentials Vn1 and Vn3 appearing on the nodes N1 and N3, respectively, also have the same waveforms as shown in FIG. 2.

When the clock signal CK is in its low level (time T0, times T3 to T5, etc.), the switch 45 remains in its ON state and delivers the potential Vn1 on the node N1 to the node N5. When the clock signal CK is in its high level (times T1 to T3, times T5 to T7, etc.), the switch 46 remains in its ON level and feeds the potential Vn3 on the node N3 to the node N5. The comparator 47 compares the potential on the node N5 with the reference potential Vref and delivers the result of comparison, i.e., output signal OUT to the output terminal 44

As stated above, the output circuit 40A selectively compares the output signal of the integrator circuit 20 or that of the integrator circuit 30 with the reference potential Vref in accordance with the level of the input signal CK. The output circuit 40A therefore needs only a single comparator and is simpler in circuit configuration than the output circuit 40, FIG. 1.

Figure 7:
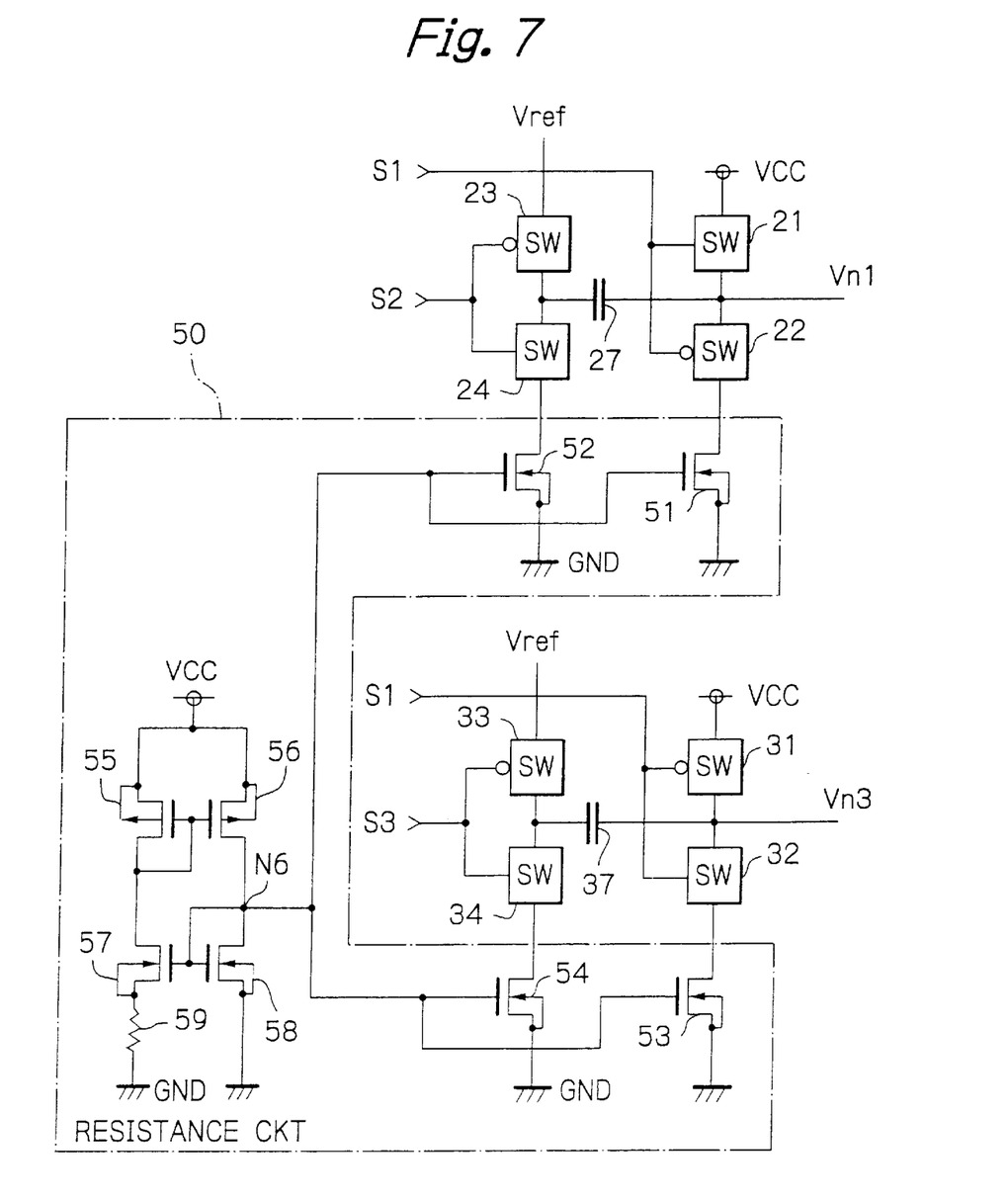
FIG. 7 is a schematic block diagram showing a resistance circuit and associated circuitry in accordance with another alternative embodiment of the present invention.

FIG. 7 shows a resistance circuit 50 representative of another alternative embodiment of the present invention. The resistance circuit 50 is substituted for the resistors 25, 26, 35 and 36 included in the integrator circuits 20 and 30, FIG. 1 or 5. As shown, the resistance circuit 50 includes n-channel MOS (Metal-Oxide Semiconductor) transistors 51, 52, 53 and 54 corresponding to the resistors 25, 26, 35 and 36, respectively. The n-channel MOS (hereinafter referred to NMOS) transistors 51 through 54 have drains thereof respectively connected to the switches 22, 24, 32 and 34. The NMOS transistors 51 through 54 have sources thereof connected in common to the ground potential GND. The resistance circuit 50 additionally includes p-channel MOS (hereinafter referred to PMOS) transistors 55 and 56 and NMOS transistors 57 and 58 constituting a constant current circuit.

The sources of the PMOS transistors 55 and 56 are connected to the power supply potential VCC. The gate and drain of the PMOS transistor 55 and the gate of the PMOS transistor 56 are connected to the drain of the NMOS transistor 57. The source of the NMOS 57 is connected to the ground potential GND via a resistor 59. The drain of the PMOS transistor 56 is connected to a node N6. The gates of the NMOS transistors 57 and 58 are also connected to the node N6. The source of the NMOS transistor 58 is connected to the ground potential GND. Further, the gates of the NMOS transistors 51 through 54 are connected to the node N6 to constitute a current mirror circuit.

The NMOS transistors 51 through 54 and 58 have substantially the same gate length as each other. The gate widths of the NMOS transistors 51 through 54 and 58 are selected such that a greater current flows through the NMOS transistor 51 than through the NMOS transistor 52, and such that a greater current flows through the NMOS transistor 53 than through the NMOS transistor 54. Such a constant current circuit and current mirror configuration allow the NMOS transistors 51 through 54 to operate in the same manner as the resistors 25, 26, 35 and 36, respectively.

As stated above, the resistance circuit 50 has a single resistor 59 and eight MOS transistors in place of four resistors 25, 26, 35 and 36 of the previous embodiments.

With the frequency multiplying circuitry 100 shown in FIG. 1, when the clock signal CK having a frequency of 32 kHz and therefore a half period TW of about 15 microseconds is multiplied, for example, the integrator circuit 20 must have a time constant of 15 microseconds or above. Assuming that the capacitors 27 and 37 have a capacitance of 10 pF each, then it is necessary to provide each of the resistors 24 and 34 with a resistance of 1.5 MÙ or above. Even if the resistors 24 and 34 are implemented by a diffusion type of resistors with a high sheet resistance, they need an area of 1,000 sheets each because the sheet resistance is approximately 1.5 kÙ. Therefore, four resistors need 4,000 sheets in total. It is to be noted that a single sheet refers to an area based on 1.5 micrometers square.

The resistance circuit 50 of the illustrative embodiment shown in FIG. 7 has a single resistor 59 and eight MOS transistors 51 through 58. However, the MOS transistors 51 through 58 need only an area corresponding to three sheets each at most. Further, the resistor 59 needs only a resistance of about 500 kÙ because of the current mirror configuration. The total area that the resistance circuit 50 needs is less than 500 sheets. The resistance circuit 50 therefore contributes a great deal to the area reduction of the frequency multiplying circuitry. Another advantage achievable with the illustrative embodiment is that an increase in resistance allows the time constant to be increased and therefore saves power.

It should be noted that the configuration of the switches 21 through 24 and 31 through 34 shown and described are only illustrative. This is also true with the current mirror configuration of the resistance circuit 50.

In summary, frequency multiplying circuitry of the present invention includes two integrator circuits each charging and discharging a respective capacitor with a particular time constant in accordance with the level of an input clock signal. An output circuit compares voltages output from the integrator circuits with a reference voltage to thereby produce an output signal that is a multiple of the clock signal. Therefore, the duty ratio of the output signal is little susceptible to the variation of, e.g., the frequency of the clock signal and power supply voltage.

Further, the output circuit selects either one of the outputs of the integrator circuits in accordance with the level of the clock signal and then compares the output voltage selected with the reference voltage. This also makes the duty ratio of the output signal little susceptible to the above variations, and in addition simplifies circuit configuration.

Moreover, a current mirror circuit is connected to a constant current source included in a resistance network. This remarkably reduces a sheet resistance area. The circuitry can therefore have its set resistance and therefore time constant to be easily increased for thereby reducing current consumption.

The entire disclosure of Japanese patent application No. 2001-393761 filed on Dec. 26, 2001, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. Frequency multiplying circuitry for multiplying a frequency of an input signal having a first logical level and a second logical level, different from the first logical level, alternating with each other at a preselected period, comprising:

a first charging and discharging circuit for charging a first capacitance with a first time constant representative of a relaxation time, which is based on a transient response of an electric circuit, in response to the first logical level of the input signal and then discharging said first capacitance with a second time constant smaller than the first time constant;

a second charging and discharging circuit for charging a second capacitance with the first time constant in response to the second logical level of the input signal and then discharging said second capacitance with the second time constant in response to the first logical level of the input signal;

an output circuit for comparing an output voltage of said first charging and discharging circuit and an output voltage of said second charging and discharging circuit with a reference voltage and raising a level of an output signal when either one of the output voltages of said first charging and discharging circuit and said second charging and discharging circuit drops below the reference voltage; and a controller for controlling charging and discharging of said first charging and discharging circuit and said second charging and discharging circuit in response to the input signal and the output signal.

2. The circuitry in accordance with claim 1, wherein said output circuit comprises:

a first comparator for comparing the output voltage of said first charging and discharging circuit with the reference voltage and raising a level of a signal to output if the output voltage is lower than the reference voltage;

a second comparator for comparing the output voltage of said second charging and discharging circuit with the reference voltage and raising a level of a signal to output if the output voltage is lower than the reference voltage; and an OR gate for producing an OR of the signals output from said first comparator and said second comparator.

3. The circuitry in accordance with claim 1, wherein said output circuit comprises:

a selecting circuit for selecting either one of said first charging and discharging circuit and said second charging and discharging circuit in accordance with the logical level of the input signal; and a comparator for comparing an voltage selected by and output from said selecting circuit with the reference voltage and raise a level of a signal to output if the voltage is lower than the reference voltage.

4. The circuitry in accordance with claim 1, wherein said controller outputs the input signal as a first control signal with a level relation of the input signal maintained, said controller comprising:

a first control signal generator for outputting a second control signal representative of an OR of the input signal and the output signal of said output circuit;

an inverter for inverting the logical level of the input signal; and a second control signal generator for outputting a third control signal representative of an OR of an output signal of said inverter and the output signal of said output circuit.

5. The circuitry in accordance with claim 2, wherein said controller outputs the input signal as a first control signal with a level relation of the input signal maintained, said controller comprising:

a first control signal generator for outputting a second control signal representative of an OR of the input signal and the output signal of said output circuit;

an inverter for inverting the logical level of the input signal; and a second control signal generator for outputting a third control signal representative of an OR of an output signal of said inverter and the output signal of said output circuit.

6. The circuitry in accordance with claim 3, wherein said controller outputs the input signal as a first control signal with a level relation of the input signal maintained, said controller comprising:

a first control signal generator for outputting a second control signal representative of an OR of the input signal and the output signal of said output circuit;

an inverter for inverting the logical level of the input signal; and a second control signal generator for outputting a third control signal representative of an OR of an output signal of said inverter and the output signal of said output circuit.

7. The circuitry in accordance with claim 1, wherein the first logical level and the second logical level are a high level and a low level, respectively, lower than the high level.

8. The circuitry in accordance with claim 5, wherein the first logical level and the second logical level are a high level and a low level, respectively, lower than the high level.

9. The circuitry in accordance with claim 6, wherein the first logical level and the second logical level are a high level and a low level, respectively, lower than the high level.

10. The circuitry in accordance with claim 1, wherein said first charging and discharging circuit comprises a first transistor and a second transistor respectively constituting a first resistor and a second resistor that are connected to said first capacitance in parallel and respectively determining the first time constant and the second time constant;

said second charging and discharging circuit comprises a third transistor and a fourth transistor respectively constituting a first resistor and a second resistor that are connected in parallel to said second capacitor and respectively determining the first time constant and the second time constant;

said first transistor, said second transistor, said third transistor and said fourth transistor are interconnected in a current mirror type differential amplifier configuration;

said current mirror type differential amplifier configuration being connected to a constant current source that feeds a constant current as a bias current.

11. Frequency multiplying circuit comprising a first charging and discharging circuit and a second charging and discharging circuit;

said first charging and discharging circuit comprising:

a pair of a first selector and a second selector and a pair of a third selector and a fourth selector operating complementarily to each other in response to control signals each having a particular level different from each other;

a first capacitance circuit intervening between a first signal line connecting said first selector and said second selector and a second signal line connecting said third selector and said fourth selector;

a feed potential line for applying a power supply voltage to said first selector;

a reference potential line for applying a first reference potential to said third selector;

a first resistor intervening between a first reference potential terminal of said second selector and a second reference potential; and a second resistor intervening between a second reference potential terminal of said fourth selector and the second reference potential and having a higher resistance than said first resistor;

said first selector and said fourth selector each becoming active when a respective control signal is in a first logical level, said second selector and said third selector each becoming active when a respective control signal is in a second logical level different from the first logical level;

said second charging and discharging circuit comprising:

a pair of a fifth selector and a sixth selector and a pair of a seventh selector and an eighth selector operating complementarily to each other in response to control signals each having a particular level different from each other;

a second capacitance circuit intervening between a third signal line connecting said fifth selector and said sixth selector and a fourth signal line connecting said seventh selector and said eighth selector;

a feed potential line for applying the power supply voltage to said fifth selector;

a reference potential line for applying the first reference potential to said seventh selector;

a third resistor intervening between a third reference potential terminal of said sixth selector and the second reference potential; and a fourth resistor intervening between a fourth reference potential terminal of said eighth selector and the second reference potential and having a higher resistance than said third resistor;

said fifth selector and said eighth selector each becoming active when a respective control signal is in the first logical level, said sixth selector and said seventh selector each becoming active when a respective control signal is in the second logical level;

said frequency multiplying circuit further comprising:

an output circuit for comparing voltages output from said first charging and discharging circuit and said second charging and discharging circuit with the first reference potential and outputting a high level as an output signal when either one of the voltages drops below the first reference potential; and a controller for feeding the control signals to said first charging and discharging circuit and said second charging and discharging circuit in response to the input signal and the output signal.

12. The circuitry in accordance with claim 11, wherein said output circuit comprises:

a first comparator for comparing the output voltage of said first charging and discharging circuit with the first reference potential and raising a level of a signal to output if the output voltage is lower than the first reference potential;

a second comparator for comparing the output voltage of said second charging and discharging circuit with the first reference potential and raising a level of a signal to output if the output voltage is lower than the first reference potential; and an OR gate for producing an OR of the signals output from said first comparator and said second comparator.

13. The circuitry in accordance with claim 11, wherein said output circuit comprises:

a selecting circuit for selecting either one of said first charging and discharging circuit and said second charging and discharging circuit in accordance with the logical level of the input signal; and a comparator for comparing an voltage selected by and output from said selecting circuit with the first reference potential and raise a level of a signal to output if the voltage is lower than the first reference potential.

14. The circuitry in accordance with claim 11, wherein said controller outputs the input signal as a first control signal with a level relation of the input signal maintained, said controller comprising:

a first control signal generator for outputting a second control signal representative of an OR of the input signal and the output signal of said output circuit;

an inverter for inverting the logical level of the input signal; and a second control signal generator for outputting a third control signal representative of an OR of an output signal of said inverter and the output signal of said output circuit.

15. The circuitry in accordance with claim 12, wherein said controller outputs the input signal as a first control signal with a level relation of the input signal maintained, said controller comprising:

a first control signal generator for outputting a second control signal representative of an OR of the input signal and the output signal of said output circuit;

an inverter for inverting the logical level of the input signal; and a second control signal generator for outputting a third control signal representative of an OR of an output signal of said inverter and the output signal of said output circuit.

16. The circuitry in accordance with claim 13, wherein said controller outputs the input signal as a first control signal with a level relation of the input signal maintained, said controller comprising:

a first control signal generator for outputting a second control signal representative of an OR of the input signal and the output signal of said output circuit;

an inverter for inverting the logical level of the input signal; and a second control signal generator for outputting a third control signal representative of an OR of an output signal of said inverter and the output signal of said output circuit.

17. The circuitry in accordance with claim 11, wherein the first logical level and the second logical level are a high level and a low level, respectively, lower than the high level.

18. The circuitry in accordance with claim 15, wherein the first logical level and the second logical level are a high level and a low level, respectively, lower than the high level.

19. The circuitry in accordance with claim 16, wherein the first logical level and the second logical level are a high level and a low level, respectively, lower than the high level.

20. The circuitry in accordance with claim 11, wherein said first charging and discharging circuit comprises a first transistor and a second transistor respectively constituting a first resistor and a second resistor that are connected to said first capacitance circuit in parallel and respectively determining the first time constant and the second time constant;

said second charging and discharging circuit comprising a third transistor and a fourth transistor respectively constituting a first resistor and a second resistor that are connected in parallel to said second capacitor and respectively determining the first time constant and the second time constant;

said first transistor, said second transistor, said third transistor and said fourth transistor being interconnected in a current mirror type differential amplifier configuration;

said current mirror type differential amplifier configuration being connected to a constant current source that feeds a constant current as a bias current.

21. The circuitry in accordance with claim 11, wherein the second reference potential is ground potential.

* * * * *